(12) United States Patent
Su et al.

(10) Patent No.: US 10,657,778 B2
(45) Date of Patent: May 19, 2020

(54) DOOR SWITCH

(71) Applicant: OMRON Corporation, Kyoto (JP)

(72) Inventors: Rina Su, Moriyama (JP); Keishi Yayama, Ritto (JP); Kazuhiro Kudo, Kusatsu (JP); Kenji Shimazu, Moriyama (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/190,147

(22) Filed: Nov. 14, 2018

(65) Prior Publication Data

US 2019/0244489 A1 Aug. 8, 2019

(30) Foreign Application Priority Data

Feb. 7, 2018 (JP) .................................. 2018-019986

(51) Int. Cl.
   *G08B 23/00* (2006.01)
   *G08B 5/36* (2006.01)
   *F21V 8/00* (2006.01)
   *H03K 17/965* (2006.01)
   *G08B 13/08* (2006.01)

(52) U.S. Cl.
   CPC ............. *G08B 5/36* (2013.01); *G02B 6/0001* (2013.01); *H03K 17/965* (2013.01); *G08B 13/08* (2013.01); *H03K 2217/958* (2013.01)

(58) Field of Classification Search
   None
   See application file for complete search history.

(56) References Cited

U.S. PATENT DOCUMENTS

| 10,203,084 | B1 * | 2/2019 | Huang .................... F21V 3/02 |
| 2013/0057404 | A1 * | 3/2013 | Thibault ................ G08B 29/22 |
| | | | 340/545.1 |
| 2014/0006823 | A1 * | 1/2014 | Lamb .................. H02J 13/0086 |
| | | | 713/323 |

FOREIGN PATENT DOCUMENTS

| EP | 2873912 | 5/2015 |
| JP | 2017098111 | 6/2017 |

OTHER PUBLICATIONS

Anonymous, "Door/Window Sensor," Jun. 17, 2015, available at: http://www.zipato.com/wp-content/uploads/2015/07/vs-zd2102-Zipato-DoorWindow-Sensor-Data-Sheet.pdf.
Christophe Pays, "Instrusction manuel:SERIE XORF safety sensor-control of machine guards and moving parts of rolling vehicles," Jul. 16 2018, available at: http://comitronic-bti.eu/documentations/datasheet/#186-rfid-datasheet-datasheet-p2.

(Continued)

*Primary Examiner* — Brent Swarthout
(74) *Attorney, Agent, or Firm* — JCIPRNET

(57) ABSTRACT

The disclosure provides a door switch that improves visibility. The door switch includes an actuator and a sensor. In addition, the door switch is installed so that when a door is closed, a surface of the sensor and an opposite surface of the actuator are in contact with or close to each other, and when the door is open, the surface of the sensor and the opposite surface of the actuator are separated from each other. The actuator outputs a detection signal. A display part for indicating a reception state of the detection signal is formed on the surface of the sensor. The surface of the sensor has a non-opposite region, wherein the non-opposite region is at least a part of the display part not opposite to the opposite surface of the actuator in the reception state.

13 Claims, 4 Drawing Sheets

(56) References Cited

OTHER PUBLICATIONS

"Search Report of Europe Counterpart Application", dated May 8, 2019, p. 1-p. 7.
Omron Switch Catalog,"D40A/G9SX-NS: Electronic Detection Mechanism for Better Stability in Non-contact Door Switch Operation," Jan. 6, 2014, Retrieved: http://www.ia.omron.com/products/family/1832/.
"Office Action of Korea Counterpart Application," dated Sep. 24, 2019, with English translation thereof, pp. 1-9.

* cited by examiner

DOOR SWITCH

CROSS-REFERENCE TO RELATED APPLICATION

This application claims the priority benefit of Japan Application No. 2018-019986, filed on Feb. 7, 2018. The entirety of the above-mentioned patent application is hereby incorporated by reference herein and made a part of this specification.

BACKGROUND

Technical Field

The disclosure relates to a technique for providing a structure that improves visibility of a door switch.

Description of Related Art

In a configuration disclosed in Japanese Laid-open No. 2017-98111, visibility is improved by causing the periphery of a switch and a switch unit to emit light.

A switch according to a configuration disclosed in European Patent Application No. 14192995 (Publication No. 2873912) includes a part that emits light in a plurality of parts in the configuration of the device to improve visibility.

Technical Problem

However, when the configurations of Japanese Laid-open No. 2017-98111 and European Patent Application No. 14192995 (Publication No. 2873912) are used, depending on the size, shape, and installation position of a signal transmitting device (such as an actuator or the like) used in combination with a sensor part, there is a concern that the part that emits light may be hidden and that visibility may be difficult to improve.

Also, particularly when used in a door switch, the sensor and the signal transmitting device are usually opposite to each other in a normal state. In this case, even if there is a place that emits light in a part of the sensor, this place is hidden by the signal transmitting device, and the visibility is difficult to improve.

Therefore, the disclosure provides a door switch that improves visibility of a light emitting state.

SUMMARY

Solution to the Problem

The door switch includes an actuator and a sensor. In addition, the door switch is installed so that, when a door is closed, a surface of the sensor and an opposite surface of the actuator are in contact with or close to each other, and when the door is open, the surface of the sensor and the opposite surface of the actuator are separated from each other.

DESCRIPTION OF THE EMBODIMENTS

The door switch includes an actuator and a sensor. In addition, the door switch is installed so that, when a door is closed, a surface of the sensor and an opposite surface of the actuator are in contact with or close to each other, and when the door is open, the surface of the sensor and the opposite surface of the actuator are separated from each other.

The actuator outputs a detection signal. A display part for indicating a reception state of the detection signal is formed on the surface of the sensor. The surface of the sensor has a non-opposite region, wherein the non-opposite region is at least a part of the display part not opposite to the opposite surface of the actuator in the reception state.

In this configuration, even if the display part of the sensor is disposed opposite to the actuator, the display part has a part not overlapping the actuator. In this way, the visibility of the display part regarding the opposite state of the door switch is improved. Therefore, an operator can confirm the state of the sensor from any direction.

In the door switch, the display part may be formed annularly along at least an outer edge of the surface of the sensor.

In this configuration, the installation position of the actuator with respect to the sensor can be made flexible. Therefore, the operator can easily confirm the state of the sensor from any position.

The sensor in the door switch may include a light source part. In addition, the display part may guide light of the light source part.

In this configuration, light of a light source part is guided, thereby further improving the visibility of the display part.

The sensor in the door switch may include a light guide part for guiding the light of the light source part to the display part.

In this configuration, even when the light source part is a point light source, the light guide part can diffuse light and allow the display part to emit light uniformly.

The sensor in the door switch may include, on a display part side of the light source part or the light guide part, a cover part for preventing the light of the light source part from diffusing to outside.

In this configuration, even when the light source part is a point light source, the cover part can hide locally bright parts and reduce unevenness of light emission.

The sensor in the door switch may include a reflection part on a back surface side of the cover part.

In this configuration, even when the light source part is a point light source, light can be further diffused and the display part can be made to emit light uniformly.

The display part in the door switch could be made of a resin.

With this configuration, manufacture is easy.

The cover part in the door switch could be made of a resin.

With this configuration, manufacture is easy.

Effects

According to the disclosure, a door switch that improves visibility of a light emitting state can be provided.

Applicable Example

Figure 1:
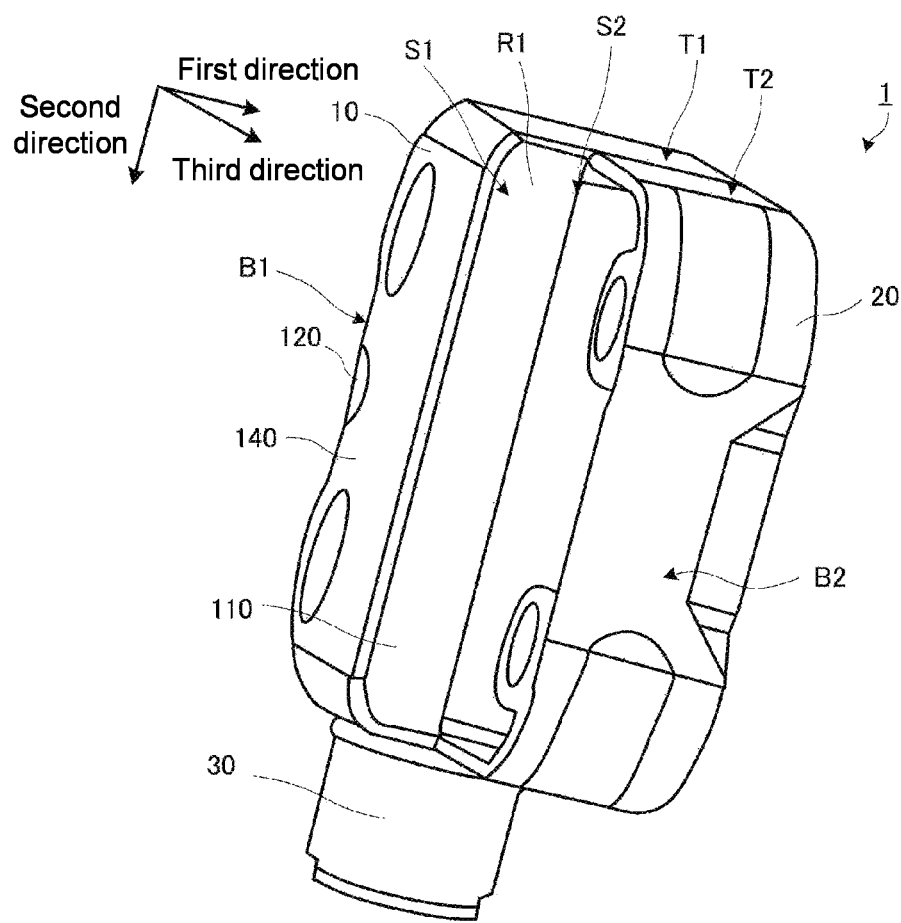
FIG. 1 is a perspective view of a door switch according to the first embodiment of the disclosure.

First, an example to which the disclosure is applied will be described with reference to FIG. 1. FIG. 1 is a schematic view of a door switch according to the first embodiment.

As shown in FIG. 1, the door switch 1 includes a sensor 10 and an actuator 20. A wiring part 30 is connected to the sensor 10 and transmits a signal received by the sensor 10 to other devices. The wiring part 30 is, for example, a connector, a cable or the like. Further, a transverse direction of the door switch 1 is defined as a first direction, and a longitudinal direction of the door switch 1 is defined as a second direction. In addition, a direction of the door switch 1 orthogonal to the first direction and the second direction is defined as a third direction.

First, a configuration of the sensor 10 will be described. The sensor 10 is formed with a display part 110, a back surface display part 120, and a sensor housing 140. The sensor 10 is formed with a surface S1, a back surface B1 and side surfaces connecting the surface S1 and the back surface B1.

In addition, among the side surfaces connecting the surface S1 and the back surface B1, a surface opposite to a surface connected with the wiring part 30 is defined as a top surface T1.

The display part 110 is formed on the surface S1 of the sensor housing 140. The back surface display part 120 is formed at a position corresponding to the approximate center of the back surface B1 of the sensor housing 140.

Next, a configuration of the actuator 20 will be described. The actuator 20 is formed with a surface S2, a back surface B2 and side surfaces connecting the surface S2 and the back surface B2. The surface S2 of the actuator 20 is the "opposite surface of the actuator" in the disclosure.

In addition, among the side surfaces connecting the surface S2 and the back surface B2, a surface on the side of the top surface T1 of the sensor 10 is defined as a top surface T2.

More specifically, an example of the relationship between the sensor 10 and the actuator 20 will be described below.

The sensor 10 includes an RFID antenna (not shown) therein. In addition, the actuator 20 includes a passive IC tag (not shown) therein.

The RFID antenna transmits radio waves to the passive IC tag and receives radio waves from the passive IC tag. In this way, an opposite state between the sensor 10 and the actuator 20 can be obtained.

Although passive RFID is shown as an example above, active RFID may be used instead. In addition, although RFID is shown as an example, the embodiments are not limited to RFID, and any configuration that can obtain the opposite state may be used.

The display part 110 emits light according to the opposite state of the door switch 1. For example, in a state where a door is open, the display part 110 emits red light, and to show a state where the door is closed, the display part 110 emits green light.

Next, an area SR1 of the surface S1 is compared with an area SR2 of the surface S2. The area SR1 is larger than the area SR2. Therefore, the sensor 10 has a region where the sensor 10 is not opposite to the actuator 20 (a non-opposite region R1 in the disclosure).

A relational expression between the non-opposite region R1, the area SR1 and the area SR2 is expressed by SR1=R1+SR2. The display part 110 is disposed so as to include at least a part of the non-opposite region R1. In this way, a user can visually recognize the display part 110 in the non-opposite region R1.

As described above, the opposite state can be detected by an opposite distance between the sensor 10 and the actuator 20.

In this way, the opposite state of the door switch 1 can be easily recognized according to a light emitting state of the non-opposite region R1 of the display part 110, thereby improving the visibility. As a result, a closed state of the door can be reliably visually recognized. On the other hand, even in an open state of the door, at least a part of the display part 110 can be reliably visually recognized. Therefore, the open and close of the door can be reliably recognized.

Configuration Example 1

Figure 2:
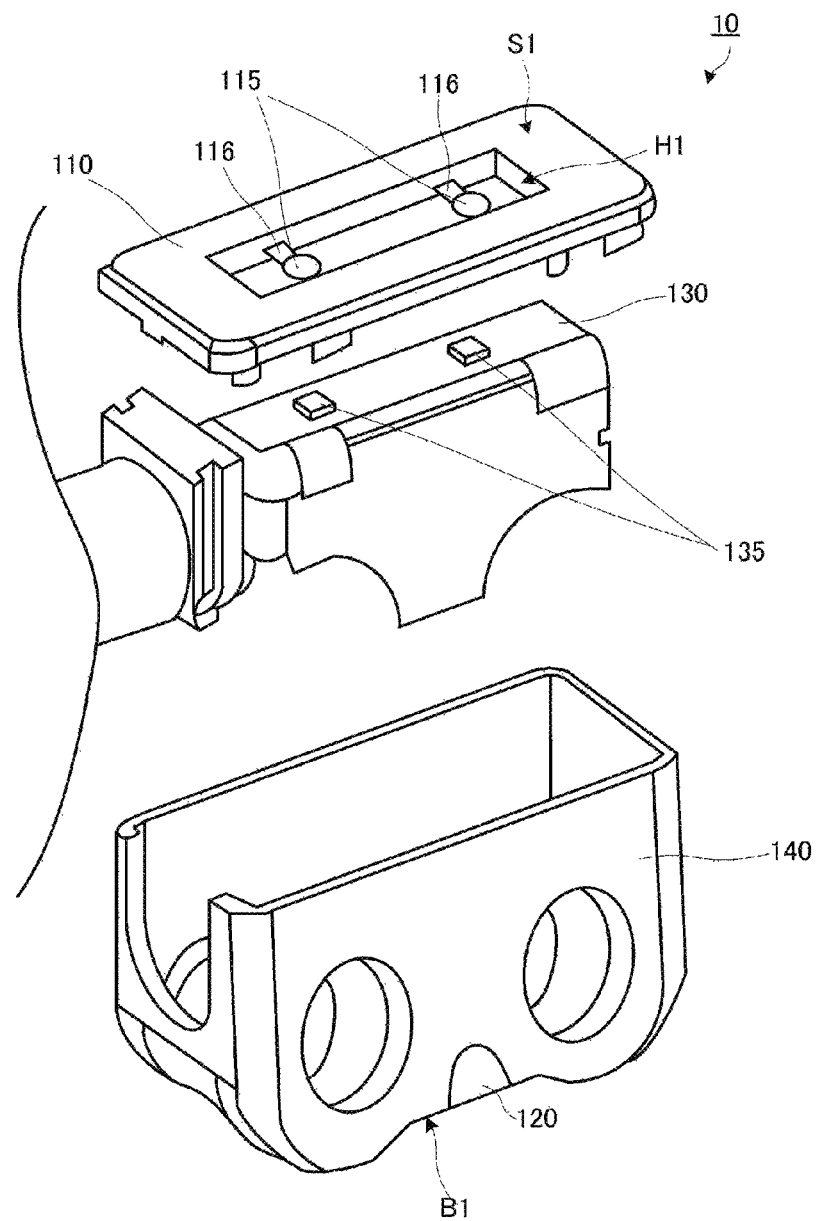
FIG. 2 is an exploded view of a sensor according to the first embodiment of the disclosure.
Figure 3:
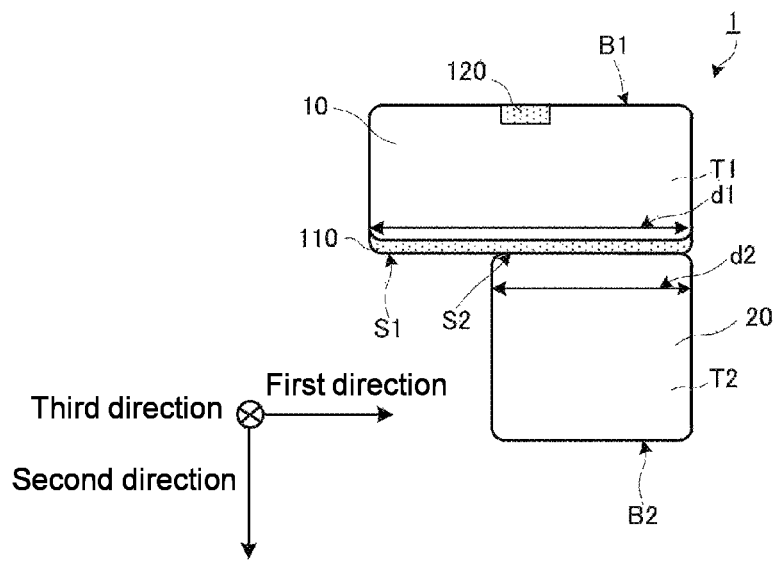
FIG. 3 is a schematic side view of a door switch according to the first embodiment of the disclosure.
Figure 4:
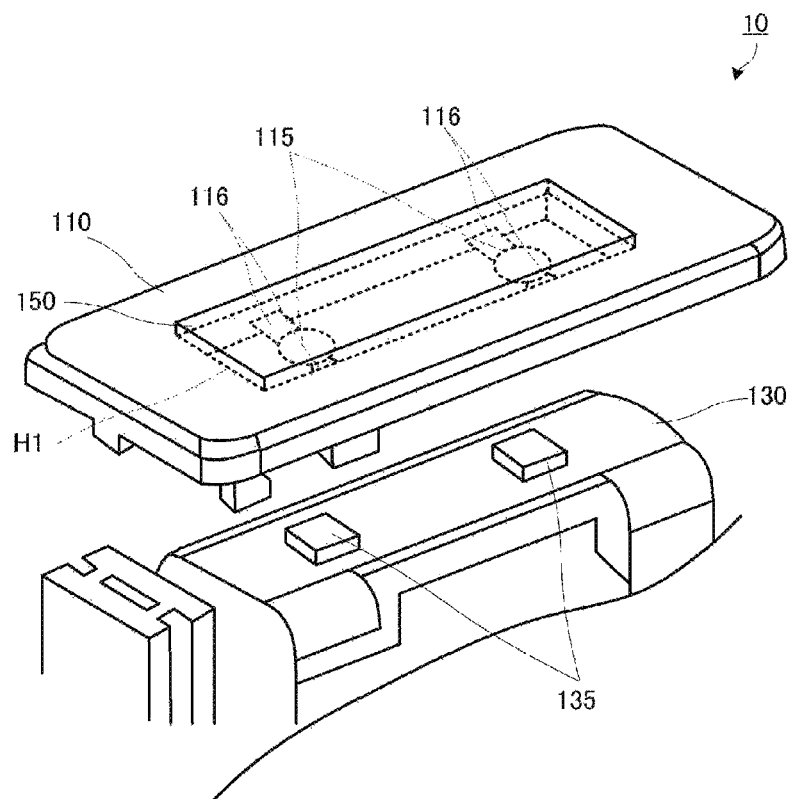
FIG. 4 is an exploded view of a sensor according to the first embodiment of the disclosure.

As described above, FIG. 1 is a perspective view of the door switch according to the first embodiment of the disclosure. FIG. 2 is an exploded view of the sensor according to the first embodiment of the disclosure. FIG. 3 is a schematic side view of the door switch according to the first embodiment of the disclosure. FIG. 4 is an exploded view of the sensor according to the first embodiment of the disclosure.

A more specific configuration example will be described with reference to FIG. 2 based on the functional configuration of FIG. 1 described above. FIG. 2 is an exploded view showing a configuration of a part of the sensor 10. In FIG. 2, only the main part of the sensor 10 is shown, and a part of the configuration is omitted.

The sensor 10 is formed with the display part 110, a substrate 130, and the sensor housing 140. In addition, the display part 110 and the substrate 130 are formed to be in contact with each other. The sensor housing 140 covers the substrate 130 and the display part 110 is disposed on a surface thereof.

The shape of the display part 110 is formed annularly along an outer edge of the surface S1 of the sensor 10. In other words, the display part 110 is a structure having a space H1 in the center. In the space H1, at least one indirect light source 115 is formed. The shape of the space H1 may be a rectangle or an ellipse and is not limited to any shape as long as the size and the shape of the space H1 can allow the indirect light source 115 to be formed. The indirect light source 115 is connected to the display part 110 by a light guide 116. A light guide part in the disclosure is a structure including the indirect light source 115 and the light guide 116.

The indirect light source 115 in the disclosure does not have a function of emitting light but has a function of diffusing light received from places outside itself.

The display part 110, the indirect light source 115 and the light guide 116 are made of translucent materials. The display part 110, the indirect light source 115, and the light guide 116 use a resin, for example, as the material. Therefore, they can be manufactured easily and at a low cost. In addition, the display part 110, the indirect light source 115 and the light guide 116 can easily be formed integrally.

At least one light source 135 is disposed on the side where the substrate 130 is in contact with the display part 110. The substrate 130 has a rigid shape or a flexible shape. The light source 135 is a point light source and is, for example, an LED. Since the light source 135 is an LED, the light source 135 can be formed relatively inexpensively, and power consumption can be reduced.

The sensor housing 140 includes the back surface display part 120 at a position corresponding to the approximate center. In addition, it is sufficient that the back surface display part 120 is formed on the back surface B1, and the formation position is not limited.

As described above, the display part 110 is formed so as to overlap the substrate 130 when viewed in a plan view. Further, the indirect light source 115 and the light source 135 could be formed to be in contact with each other. With this configuration, light from the light source 135 can directly enter the indirect light source 115, and the light can be diffused to the display part 110 via the indirect light source 115 and the light guide 116. In this way, the light guide efficiency is improved.

A detailed positional relationship of the sensor 10 and the actuator 20 in contact with each other will be described with reference to FIG. 3. FIG. 3 is a schematic side view of the door switch 1 when the sensor 10 is viewed in a plan view from the side of the top surface T1.

The surface S1 of the sensor 10 and the surface S2 of the actuator 20 are disposed so as to be in contact with each other. That is, the actuator 20 is disposed on the second direction side of the sensor 10. In addition, since the display part 110 is formed on the side of the surface S1 of the sensor 10, the display part 110 and the surface S2 of the actuator 20 are in contact with each other.

A length of the display part 110 of the sensor 10 in the first direction is defined as d1. Similarly, a length of the actuator 20 in the first direction is defined as d2. The relationship between the length d1 and the length d2 can be defined as d1>d2, for example.

Thus, for example, even if the sensor 10 is fixed and the actuator 20 is in contact with any position of the display part 110 in the first direction, the display part 110 can be visually recognized easily.

As shown in FIG. 2, since the display part 110 is formed so as to cover the outer edge of the sensor 10, the opposite state of the door switch 1 can be easily determined according to the light emission of the display part 110.

In addition, in a general door switch, the sensor 10 and the actuator 20 are disposed flush with one side face, as shown in FIG. 2. In this case, the visibility of the display part 110 can also be improved with the above configuration. In this way, it is easy to accurately dispose the door switch 1 having the display part 110 with good visibility at a desired position of the door.

As shown in FIG. 1, a case in which the top surface T1 of the sensor 10 and the top surface T2 of the actuator 20 are disposed so as to be flush with each other is shown as an example, but the sensor 10 may be disposed at a position where the opposite state from the actuator 20 can be detected. In other words, the disposition position and orientation are not limited.

In addition, when the surface S1 of the sensor 10 and the surface S2 of the actuator 20 are disposed so as to be contactable with each other, that is, when the distance between the surface S1 and the surface S2 is within a prescribed range, the sensor 10 and the actuator 20 are in the opposite state. At this time, the door switch 1 is in the closed state.

Further, when the distance between the surface S1 of the sensor 10 and the surface S2 of the actuator 20 is out of the prescribed range, the sensor 10 and the actuator 20 are in a non-opposite state. At this time, the door switch 1 is in the open state.

In the disclosure, the state in which the visibility needs to be improved is the above-mentioned open state. For example, when a part of the actuator 20 overlaps the sensor 10, it is difficult to determine whether the door is in the open state or in the closed state.

However, by using the above configuration, the opposite state of the door switch 1 can be easily recognized according to the light emitting state of the non-opposite region R1 of the display part 110, and the visibility is improved. As a result, the closed state of the door can be reliably visually recognized. On the other hand, even in the open state of the door, at least a part of the display part 110 can be reliably visually recognized. Therefore, the open and close of the door can be reliably recognized.

With reference to FIG. 4, a light emitting structure for further improving the visibility in the display part 110 of the sensor 10 will be described. As shown in FIG. 4, the space H1 in which the indirect light source 115 is formed is covered by a cover part 150. The cover part 150 may have any shape that covers at least the space H1.

In addition, the cover part 150 may be formed with, for example, an opaque resin as the material.

Light from the light source 135 is the strongest in the indirect light source 115. The light is diffused and absorbed by a back surface of the cover part 150. The light diffused by the cover part 150 is guided to the display part 110. Also, by providing the cover part 150, there is an effect that strong light spots of the light integrated by the indirect light source 115 can be hidden. As a result, unevenness of the luminance of the surface S1 of the sensor 10 is reduced, and the display part 110 emits light uniformly, and the illuminance is improved.

Configuration Example 2

Figure 5:
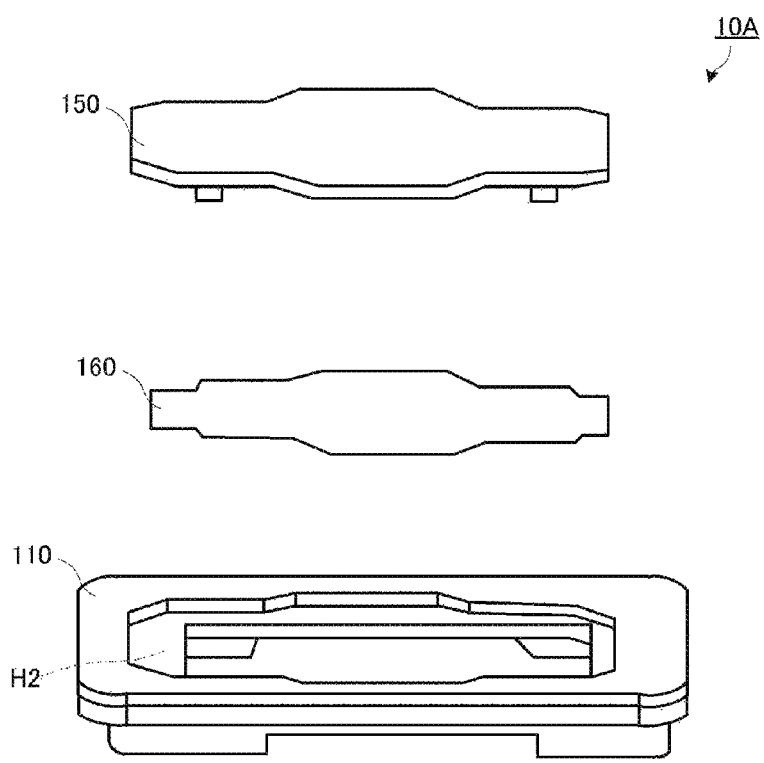
FIG. 5 is an exploded view of a part of a sensor according to the second embodiment of the disclosure.

Next, an overview of a door switch according to the second embodiment will be described with reference to FIG. 5. FIG. 5 is an exploded view of a part of a sensor according to the second embodiment of the disclosure.

The second embodiment differs from the first embodiment in the shape of a space H2 and in that a sensor 10A includes a reflection part 160 and that an indirect light source is not included. The other points are the same as those of the first embodiment, and descriptions of the same places are omitted.

The sensor 10A includes the space H2. The reflection part 160 is fitted in the space H2, that is, the reflection part 160 is included in the space H2.

In addition, the shape of the space H2 may be a rectangle or an ellipse and may be in any shape as long as the size and the shape of the space H2 can allow the reflection part 160 to be formed.

Therefore, the reflection part 160 reflects light from the light source 135 (not shown in FIG. 5), and the reflected light is guided to the display part 110.

As a result, the display part 110 can emit light uniformly and improve illuminance.

Even in this configuration, the opposite state of the door switch 1 can be easily recognized according to the light emitting state of the non-opposite region R1 of the display part 110, thereby improving the visibility. As a result, the closed state of the door can be reliably visually recognized. On the other hand, even in the open state of the door, at least a part of the display part 110 can be reliably visually recognized. Therefore, the open and close of the door can be reliably recognized.

In this embodiment, a structure without an indirect light source included therein has been described. However, the same effects can be achieved even with a structure including an indirect light source.

What is claimed is:

1. A door switch comprising an actuator and a sensor, wherein
   the door switch is installed so that when a door is closed, a surface of the sensor and an opposite surface of the actuator are in contact with or close to each other, and
   when the door is open, the surface of the sensor and the opposite surface of the actuator are separated from each other,
   the actuator outputs a detection signal,
   a display part for indicating a reception state of the detection signal is formed on the surface of the sensor, and
   the surface of the sensor has a non-opposite region, wherein the non-opposite region is at least a part of the display part not opposite to the opposite surface of the actuator in the reception state and is configured to indicate the reception state, and wherein the sensor comprises a light source part inside, and the display part guides light of the light source part.

2. The door switch according to claim 1, wherein the display part is formed annularly along at least an outer edge of the surface of the sensor.

3. The door switch according to claim 1, wherein the sensor comprises a light guide part for guiding the light of the light source part to the display part.

4. The door switch according to claim 2, wherein the sensor comprises a light guide part for guiding the light of the light source part to the display part.

5. The door switch according to claim 1, wherein the sensor comprises, on a display part side of the light source part or the light guide part, a cover part for preventing the light of the light source part from diffusing to outside.

6. The door switch according to claim 2, wherein the sensor comprises, on a display part side of the light source part or the light guide part, a cover part for preventing the light of the light source part from diffusing to outside.

7. The door switch according to claim 1, wherein the sensor comprises a reflection part on a back surface side of the cover part.

8. The door switch according to claim 2, wherein the sensor comprises a reflection part on a back surface side of the cover part.

9. The door switch according to claim 1, wherein the display part is made of a resin.

10. The door switch according to claim 5, wherein the cover part is made of a resin.

11. The door switch according to claim 6, wherein the cover part is made of a resin.

12. The door switch according to claim 7, wherein the cover part is made of a resin.

13. The door switch according to claim 8, wherein the cover part is made of a resin.

* * * * *